United States Patent
Brehmer

(10) Patent No.: US 6,442,738 B1
(45) Date of Patent: Aug. 27, 2002

(54) RTL BACK ANNOTATOR

(75) Inventor: Joseph J. Brehmer, Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/879,297

(22) Filed: Jun. 12, 2001

(51) Int. Cl.[7] .............................................. G06F 17/50
(52) U.S. Cl. .................................. 716/5; 716/6; 716/18
(58) Field of Search .................................. 716/5, 6, 18

(56) References Cited

U.S. PATENT DOCUMENTS 5,910,897 A * 6/1999 Danelo et al. ................ 716/18
5,933,356 A * 8/1999 Rostoker et al. ................ 716/6
5,991,523 A * 11/1999 Williams et al. ............... 716/18

* cited by examiner

Primary Examiner—Trong Phan
(74) Attorney, Agent, or Firm—Suiter & Associates PC

(57) ABSTRACT

An RTL back annotator for applying back annotated data to the RTL code of an RTL simulation for verifying actual timing performance for an ASIC array after layout during RTL simulation parses through annotation data from the back annotation file for the ASIC layout and generates RTL delays for each wire and register in the ASIC layout. The RTL annotator then applies the generated RTL delays to the RTL compiled design, thereby emulating the delays that a gate level netlist would have. In this manner, an RTL simulation having timings of the real layout may be run.

20 Claims, 3 Drawing Sheets

RTL BACK ANNOTATOR

FIELD OF THE INVENTION

The present invention relates generally to systems and methods for providing ASIC (Application Specific Integrated Circuit) simulation, and more particularly to an RTL back annotator for applying back annotations in RTL (Register Transfer Language), thereby providing fast ASIC simulations utilizing back annotated data.

BACKGROUND OF THE INVENTION

Electronic system design for single or multiple chip circuits is becoming extremely complex. Because of the size of circuits being designed, breadboard prototyping is typically no longer feasible. Thus, some type of simulation of the circuit being designed is necessary. Presently, at-speed gate level simulations are utilized for verifying actual timing performance for an ASIC array after layout. A back-annotation file provides the actual metal delays for the ASIC layout combined with the actual fan-out and wire-OR delays for internal nets, actual package pin, and system capacitive load delays.

Due to ever increasing complexity, gate level simulation often cannot be easily computed. In particular, gate level simulations utilizing back annotated data often take long periods of time to run. Consequently, formal verification using a timing verifier is often used to verify verifying actual timing performance of an ASIC array. Timing verifiers attempt to predict circuit performance under real-time conditions without actually running simulations using back annotated data. However, such verifiers typically require that the designer develop a different model, increasing the effort required. Further, in some instances, it may still be necessary or desirable to provide actual simulation in addition to formal verification.

RTL simulations typically run much faster than comparable gate level analyses, often providing upwards of a ten fold decrease in run time. However, RTL simulations presently do not allow for consideration of back annotated data for verifying actual timing performance for an ASIC array after layout, as do gate level simulations or formal verification. Consequently, there exists a need to provide a means of applying back annotated data to the RTL code of an RTL simulation for verifying actual timing performance for an ASIC array after layout during RTL simulation.

SUMMARY OF THE INVENTION

Accordingly, the present invention is directed to an RTL back annotator for applying back annotated data to the RTL code of an RTL simulation for verifying actual timing performance for an ASIC array after layout during RTL simulation. In exemplary embodiments, the RTL back annotator parses through annotation data from the back annotation file for the ASIC layout. RTL delays are then generated for delays in the ASIC layout. These RTL delays are then applied to the RTL compiled design, thereby emulating the delays that a gate level netlist would have. In this manner, an RTL simulation having timings of the real layout may be run.

It is to be understood that both the foregoing general description and the following detailed description are exemplary and explanatory only and are not restrictive of the invention as claimed. The accompanying drawings, which are incorporated in and constitute a part of the specification, illustrate presently preferred embodiments of the invention, and together with the general description given above and the detailed description of the preferred embodiments given below, serve to explain the principles of the invention.

BRIEF DESCRIPTION OF THE DRAWINGS

The detailed description of the invention may be best understood when read in reference to the accompanying drawings wherein.

DETAILED DESCRIPTION OF THE INVENTION

Reference will now be made in detail to the presently preferred embodiments of the invention, an examples of which are illustrated in the accompanying drawings.

Figure 1:
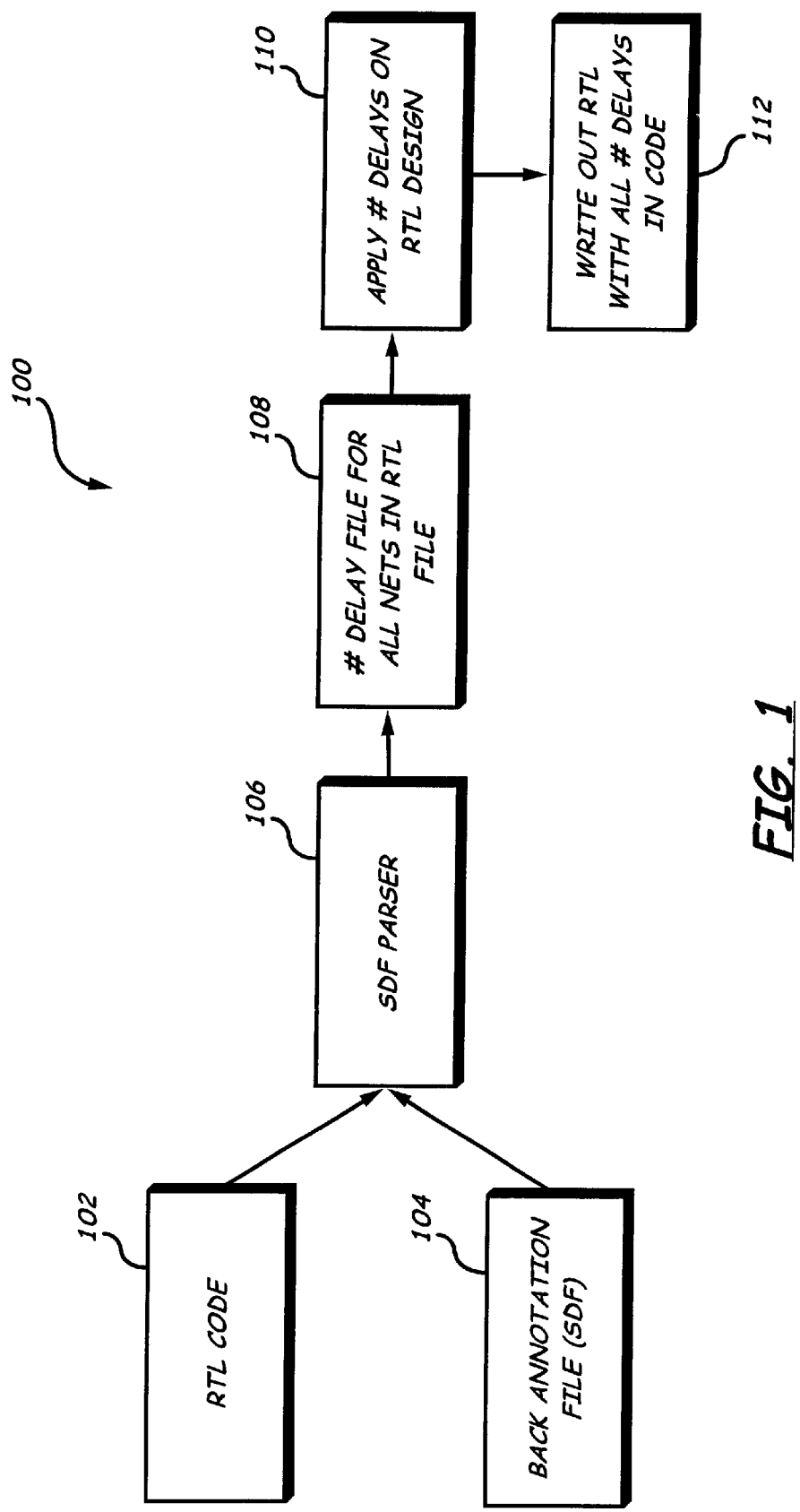
FIG. 1 is a block diagram illustrating an RTL back annotator in accordance with an exemplary embodiment of the present invention.

FIG. 1 illustrates an RTL back annotator in accordance with an exemplary embodiment of the invention. RTL back annotator 100 applies back annotated data to the RTL code of an RTL simulation for verifying actual timing performance for an ASIC array after layout during RTL simulation. In exemplary embodiments, the RTL back annotator retrieves or is provided with the RTL code 102 of the RTL simulation and an annotation file 104 containing back annotated data. RTL code 102 may be written in any suitable hardware description language such as, for example, Verilog complying with IEEE 1364 or VHDL (Very High Speed Integrated Circuit Hardware Description Language) complying with IEEE 1076. Back annotated data contained in annotation file 104 provides timing delays in the ASIC layout. Such timing delays may, for example, include but are not limited to internal net delays, metal delays, fan-out delays, wire-OR delays, ASIC package pin delays, and capacitive load delays. In exemplary embodiments, back annotated data contained in annotation file 104 may utilize a Standard Delay Format (SDF), or the like.

RTL back annotator 100 further includes a parser module 106 for parsing through the annotated data of annotation file 104 to extract timing delays in the ASIC layout. For instance, as shown in FIG. 1, parser module 106 may comprise an SDF parser for parsing data having an SDF format. A generator module 108 may then generate an RTL delay file containing RTL delays corresponding to timing delays in the ASIC layout extracted from the back annotated data of annotation file 104. For instance, using Verilog or VHDL, a timing delay may be modeled by applying a "pound delay" in the RTL code. For example, using the Verilog syntax or language, a pound delay may be generated as follows:

if (TReset) begin EncodedSof<+#1 5'b0

Thus, after one time period (in this example, a time period is 1 nsec) the value of Encoded Sof will be zeros. Preferably, such pound delays can be inserted for combinatorial code as well as registered code throughout the RTL code simulating the ASIC layout. The generated RTL delays (pound delays) are then applied in computer memory to the compiled RTL design by applier module 110. The RTL code with all RTL delays (e.g., pound delays) may be written out by module 112 for use by the designer in verifying the code.

Figure 2:
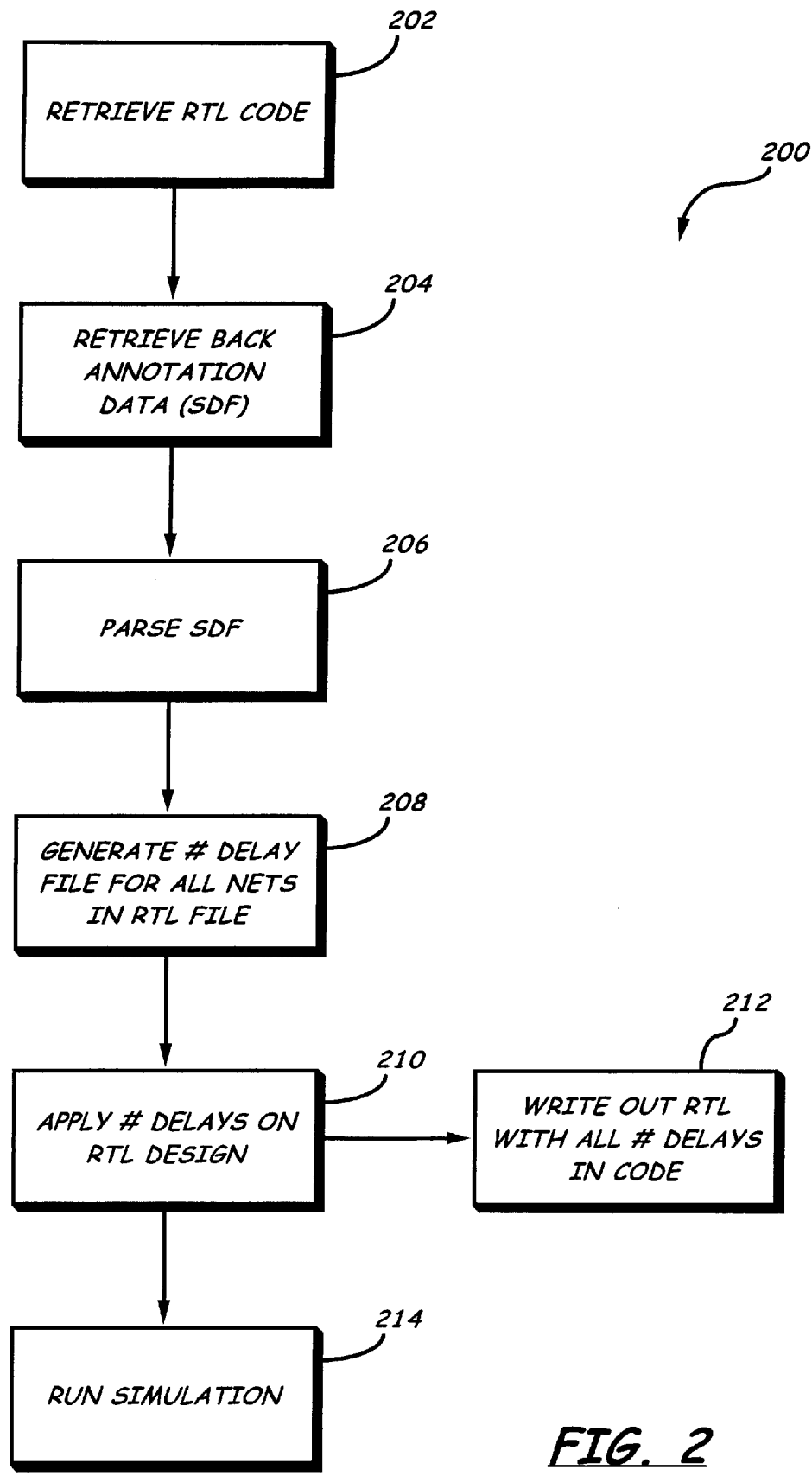
FIG. 2 is a flow diagram illustrating a method for applying back annotations on RTL for a simulation.

Referring now to FIG. 2, a method for verifying actual timing performance for an ASIC array after layout by applying back annotated data to the RTL code of an RTL simulation is described. In the exemplary embodiment shown, method 200 is begun when the RTL code of the RTL simulation and an annotation file containing back annotated data are retrieved at steps 102 & 104. As discussed in the description of FIG. 1, the RTL code may be written in any suitable hardware description language such as Verilog (IEEE 1364) or VHDL (IEEE 1076). Back annotated data contained in annotation file provides timing delays in the ASIC layout including internal net delays, metal delays, fan-out delays, wire-OR delays, ASIC package pin delays, and capacitive load delays, and the like, utilizing a Standard Delay Format (SDF), or the like. The annotated data of the annotation file is next parsed at step 206 to extract timing delays in the ASIC layout. An RTL delay file containing RTL delays corresponding to the timing delays in the ASIC layout extracted from the back annotated data of annotation file 104 at step 204 is next generated at step 206. For instance, using Verilog or VHDL, a timing delay may be modeled by applying a "pound delay" in the RTL code as discussed in the description of FIG. 1. The generated RTL delays (pound delays) are then applied in computer memory to the compiled RTL design at step 210. The RTL code with all RTL delays (e.g., pound delays) may be written out at step 212 for use by the designer in verifying the code. Finally, the RTL simulation may be run at step 214.

Thus, as described herein, the RTL back annotator allows an RTL simulation to be run that is capable of emulating the delays that a gate level netlist would have. Because RTL simulations take substantially less time to run than do gate level simulations, a substantial savings in time and cost is achieved.

Figure 3:
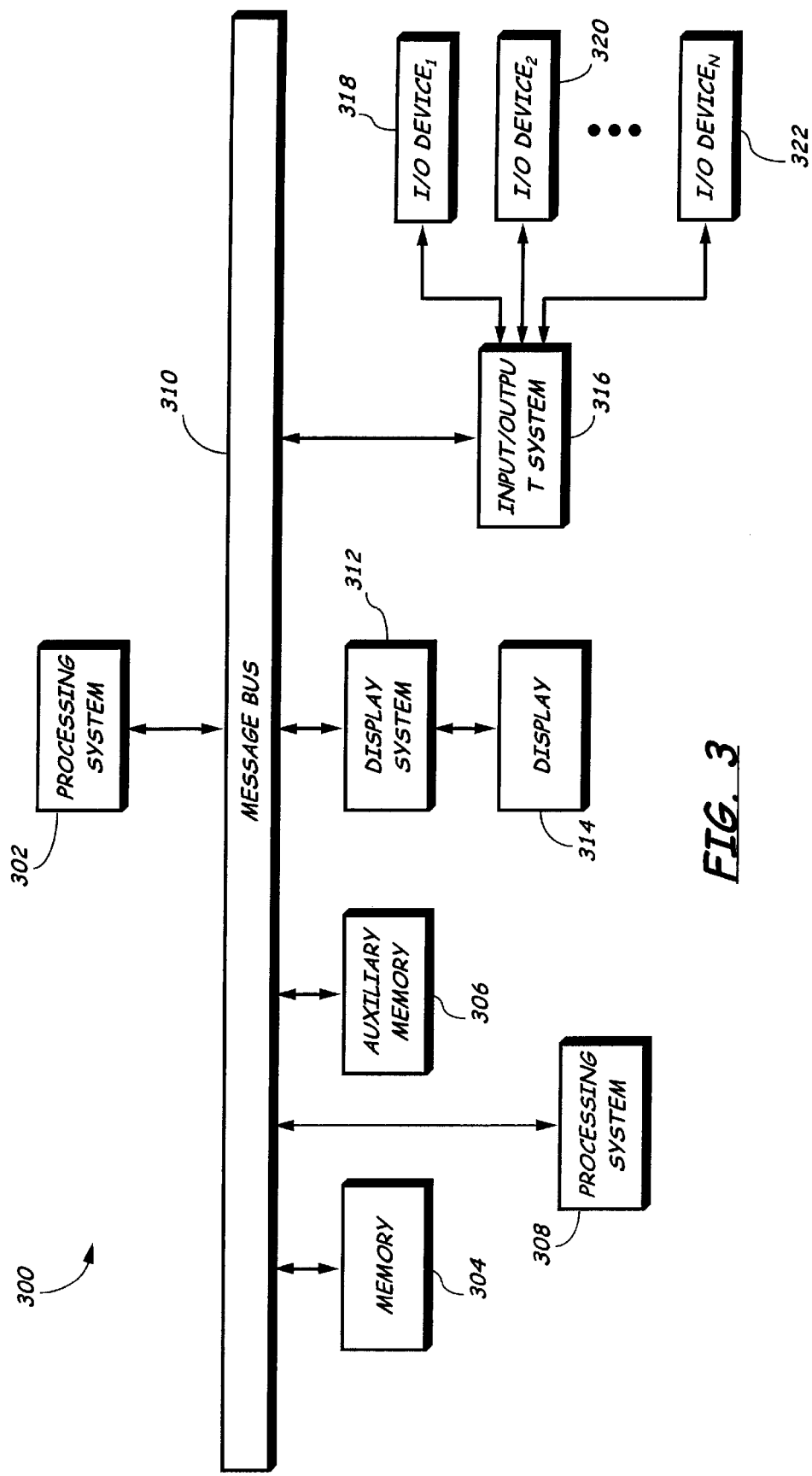
FIG. 3 is a block diagram illustrating an exemplary hardware architecture of a computer system suitable of implementing fault isolator of the present invention.

The present invention may be implemented as programs of instructions resident in the memory of one or more computer systems or workstations configured generally as described in FIG. 3. Until required by the computer system, the set of instructions may be stored in another readable memory device, for example, in a hard disk drive or in a removable memory such as an optical disk for utilization in a CD-ROM drive or a DVD drive, a floppy disk for utilization in a floppy disk drive, a personal computer memory card for utilization in a personal computer card slot, or the like. Further, the program of instructions can be stored in the memory of another computer system or server and transmitted over a local area network or a wide area network, such as the Internet, an Intranet, or the like, when desired by the user. Additionally, the instructions may be transmitted over a network in the form of an applet that is interpreted or compiled after transmission to the computer system or server rather than prior to transmission. One skilled in the art would appreciate that the physical storage of the sets of instructions or applets physically changes the medium upon which it is stored electrically, magnetically, chemically, physically, optically or holographically so that the medium carries computer readable information.

It will be appreciated that various functions of the RTL back annotator 100 (FIG. 1) have been represented as being implemented as modules 106–112 in the embodiment shown. However, it is contemplated that the specific code implementing the RTL back annotator need not be modular in design. In such non-modular implementations, modules or blocks 106–112 would merely represent steps or functions performed by the RTL back annotator 100. Further, it is understood that the specific order or hierarchies of steps in the methods disclosed are examples of exemplary approaches. Based upon design preferences, it is contemplated that the specific order or hierarchy of steps in the method can be rearranged while remaining within the scope of the present invention. The attached method claims present elements of the various steps in a sample order, and are not meant to be limited to the specific order or hierarchy presented.

Referring now to FIG. 3, an exemplary hardware system generally representative of an information handling system sold or leased to host customers in accordance with the present invention is shown. The hardware system 300 is controlled by a central processing system 302. The central processing system 302 includes a central processing unit such as a microprocessor or microcontroller for executing programs, performing data manipulations and controlling the tasks of the hardware system 300. Communication with the central processor 302 is implemented through a system bus 310 for transferring information among the components of the hardware system 300. The bus 310 may include a data channel for facilitating information transfer between storage and other peripheral components of the hardware system. The bus 310 further provides the set of signals required for communication with the central processing system 302 including a data bus, address bus, and control bus. The bus 310 may comprise any state of the art bus architecture according to promulgated standards, for example, industry standard architecture (ISA), extended industry standard architecture (EISA), Micro Channel Architecture (MCA), peripheral component interconnect (PCI) local bus, standards promulgated by the Institute of Electrical and Electronics Engineers (IEEE) including IEEE 488 general-purpose interface bus (GPIB), IEEE 696/S-100, and so on. Other components of the hardware system 300 include main memory 304 and auxiliary memory 306. The hardware system 300 may further include an auxiliary processing system 308 as required. The main memory 304 provides storage of instructions and data for programs executing on the central processing system 302. The main memory 304 is typically semiconductor-based memory such as dynamic random access memory (DRAM) and/or static random access memory (SRAM). Other semi-conductor-based memory types include, for example, synchronous dynamic random access memory (SDRAM), Rambus dynamic random access memory (RDRAM), ferroelectric random access memory (FRAM), and so on. The auxiliary memory 306 provides storage of instructions and data that are loaded into the main memory 304 before execution. The auxiliary memory 306 may include semiconductor based memory such as read-only memory (ROM), programmable read-only memory (PROM), erasable programmable read-only memory (EPROM), electrically erasable read-only memory (EEPROM), or flash memory (block oriented memory similar to EEPROM). The auxiliary memory 306 may also include a variety of non-semiconductor-based memories, including but not limited to magnetic tape, drum, floppy disk, hard disk, optical, laser disk, compact disc read-only memory (CD-ROM), write once compact disc (CD-R), rewritable compact disc (CD-RW), digital versatile disc read-only memory (DVD-ROM), write once DVD (DVD-R), rewritable digital versatile disc (DVD-RAM), etc. Other varieties of memory devices are contemplated as well. The hardware system 300 may optionally include an auxiliary processing system 308 which may be an auxiliary processor to manage input/output, an auxiliary processor to perform floating point mathematical operations, a digital signal processor (a special-purpose microprocessor having an architecture suitable for fast execution of signal processing algorithms), a back-end processor (a slave processor subordinate to the main processing system), an additional microprocessor or controller for dual or multiple processor systems, or a coprocessor. It will be recognized that such auxiliary processors may be discrete processors or may be built in to the main processor.

The hardware system 300 further includes a display system 312 for connecting to a display device 314, and an input/output (I/O) system 316 for connecting to one or more I/O devices 318, 320, and up to N number of I/O devices 322. The display system 312 may comprise a video display adapter having all of the components for driving the display device, including video memory, buffer, and graphics engine as desired. Video memory may be, for example, video random access memory (VRAM), synchronous graphics random access memory (SGRAM), windows random access memory (WRAM), and the like. The display device 314 may comprise a cathode ray-tube (CRT) type display such as a monitor or television, or may comprise an alternative type of display technology such as a projection-type CRT display, a liquid-crystal display (LCD) overhead projector display, an LCD display, a light-emitting diode (LED) display, a gas or plasma display, an electroluminescent display, a vacuum fluorescent display, a cathodoluminescent (field emission) display, a plasma-addressed liquid crystal (PALC) display, a high gain emissive display (HGED), and so forth. The input/output system 316 may comprise one or more controllers or adapters for providing interface functions between the one or more I/O devices 318–322. For example, the input/output system 316 may comprise a serial port, parallel port, universal serial bus (USB) port, IEEE 1394 serial bus port, infrared port, network adapter, printer adapter, radio-frequency (RF) communications adapter, universal asynchronous receiver-transmitter (UART) port, etc., for interfacing between corresponding I/O devices such as a keyboard, mouse, trackball, touchpad, joystick, trackstick, infrared transducers, printer, modem, RF modem, bar code reader, charge-coupled device (CCD) reader, scanner, compact disc (CD), compact disc read-only memory (CD-ROM), digital versatile disc (DVD), video capture device, TV tuner card, touch screen, stylus, electroacoustic transducer, microphone, speaker, audio amplifier, etc. The input/output system 316 and I/O devices 318–322 may provide or receive analog or digital signals for communication between the hardware system 300 of the present invention and external devices, networks, or information sources. The input/output system 316 and I/O devices 318–322 preferably implement industry promulgated architecture standards, including Ethernet IEEE 802 standards (e.g., IEEE 802.3 for broadband and baseband networks, IEEE 802.3z for Gigabit Ethernet, IEEE 802.4 for token passing bus networks, IEEE 802.5 for token ring networks, IEEE 802.6 for metropolitan area networks, and so on), Fibre Channel, digital subscriber line (DSL), asymmetric digital subscriber line (ASDL), frame relay, asynchronous transfer mode (ATM), integrated digital services network (ISDN), personal communications services (PCS), transmission control protocol/Internet protocol (TCP/IP), serial line Internet protocol/point to point protocol (SLIP/PPP), and so on. It should be appreciated that modification or reconfiguration of the hardware system 300 of FIG. 3 by one having ordinary skill in the art would not depart from the scope or the spirit of the present invention.

It is believed that the RTL back annotator of the present invention and many of its attendant advantages will be understood by the forgoing description, and it will be apparent that various changes may be made in the form, construction and arrangement of the components thereof without departing from the scope and spirit of the invention or without sacrificing all of its material advantages, the form herein before described being merely an explanatory embodiment thereof. It is the intention of the following claims to encompass and include such changes.

What is claimed is:

1. An RTL back annotator, comprising:
    a parser module for parsing through back annotation data for an ASIC layout to determine delays in the ASIC layout;
    a generator module for generating an RTL delay corresponding to the delay parsed from annotation data for the ASIC layout; and
    an applier module for applying the generated RTL delay to a compiled RTL simulation,
    wherein the RTL simulation is capable of at least partially verifying actual timing performance for an ASIC layout.

2. The RTL back annotator as claimed in claim 1, wherein the generated RTL delay is a pound delay having a Verilog syntax.

3. The RTL back annotator as claimed in claim 1, wherein the generated RTL delay is a pound delay having a VHDL syntax.

4. The RTL back annotator as claimed in claim 1, wherein the back annotation data is retrieved from an annotation file.

5. The RTL back annotator as claimed in claim 4, wherein the annotation file provides at least one of a metal delay, a fan-out delay, a wire-OR delay, an internal net delay, an ASIC package pin delay, and a capacitive load delays.

6. An RTL back annotator, comprising:
    means for parsing through annotation data for an ASIC layout to determine delays in the ASIC layout;
    means for generating an RTL delay corresponding to the delay parsed from annotation data for the ASIC layout; and
    means for applying the generated RTL delay to a compiled RTL simulation,
    wherein the RTL simulation is capable of at least partially verifying actual timing performance for an ASIC layout.

7. The RTL back annotator as claimed in claim 6, wherein the generated RTL delay is a pound delay having a Verilog syntax.

8. The RTL back annotator as claimed in claim 6, wherein the generated RTL delay is a pound delay having a VHDL syntax.

9. The RTL back annotator as claimed in claim 6, wherein the back annotation data is retrieved from an annotation file.

10. The RTL back annotator as claimed in claim 9, wherein the annotation file provides at least one of a metal delay, a fan-out delay, a wire-OR delay, an internal net delay, an ASIC package pin delay, and a capacitive load delays.

11. A method for applying back annotated data to the RTL code of an RTL simulation, comprising:
    parsing through annotation data for an ASIC layout to determine delays in the ASIC layout;
    generating an RTL delay corresponding to the delay parsed from annotation data for the ASIC layout; and
    applying the generated RTL delay to a compiled RTL simulation,
    wherein the RTL simulation is capable of at least partially verifying actual timing performance for an ASIC layout.

12. The method as claimed in claim 11, further comprising generating an RTL simulation of an ASIC layout.

13. The method as claimed in claim 11, further comprising retrieving an annotation file containing back annotated data for the ASIC layout.

14. The method as claimed in claim 13, wherein the annotation file provides at least one of a metal delay, a fan-out delay, a wire-OR delay, an internal net delay, an ASIC package pin delay, and a capacitive load delays.

15. The method as claimed in claim 11, wherein the generated RTL delay is a pound delay having a Verilog syntax.

16. The method as claimed in claim 11, wherein the generated RTL delay is a pound delay having a VHDL syntax.

17. A method for verifying actual timing performance for an ASIC array after layout, comprising:

generating an RTL simulation of an ASIC layout;

retrieving an annotation file containing back annotated data for the ASIC layout;

parsing through the back annotation data to determine delays in the ASIC layout;

generating an RTL delay corresponding to the delay parsed from the annotation data for the ASIC layout;

applying the generated RTL delay to a compiled RTL simulation; and running the RTL simulation, wherein the RTL simulation is capable of at least partially verifying actual timing performance for an ASIC layout.

18. The method as claimed in claim 13, wherein the annotation file provides at least one of a metal delay, a fan-out delay, a wire-OR delay, an internal net delay, an ASIC package pin delay, and a capacitive load delays.

19. The method as claimed in claim 17, wherein the generated RTL delay is a pound delay having a Verilog syntax.

20. The method as claimed in claim 17, wherein the generated RTL delay is a pound delay having a VHDL syntax.

* * * * *